(12) United States Patent
Ishitsuka et al.

(10) Patent No.: US 8,723,287 B2
(45) Date of Patent: May 13, 2014

(54) THERMAL AIRFLOW SENSOR

(75) Inventors: Norio Ishitsuka, Kasumigaura (JP); Rintaro Minamitani, Tsukuba (JP); Keiji Hanzawa, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/810,814

(22) PCT Filed: Jul. 6, 2011

(86) PCT No.: PCT/JP2011/065463
§ 371 (c)(1),
(2), (4) Date: Jan. 17, 2013

(87) PCT Pub. No.: WO2012/011387
PCT Pub. Date: Jan. 26, 2012

(65) Prior Publication Data
US 2013/0119504 A1 May 16, 2013

(30) Foreign Application Priority Data
Jul. 23, 2010 (JP) .................................. 2010-165449

(51) Int. Cl.
*H01L 31/058* (2006.01)
(52) U.S. Cl.
USPC ....... 257/467; 257/417; 257/419; 257/E21.49
(58) Field of Classification Search
USPC ........................................ 257/417, 419, 467
See application file for complete search history.

(56) References Cited

U.S. PATENT DOCUMENTS

| 4,888,988 | A | * | 12/1989 | Lee et al. | ................... 73/204.26 |
| 5,242,863 | A | * | 9/1993 | Xiang-Zheng et al. | ......... 438/53 |
| 5,672,551 | A | * | 9/1997 | Fung | ............................... 438/53 |
| 6,167,761 | B1 | * | 1/2001 | Hanzawa et al. | ............... 73/724 |
| 6,557,411 | B1 | * | 5/2003 | Yamada et al. | ............ 73/204.26 |
| 7,621,180 | B2 | | 11/2009 | Sakuma | |

FOREIGN PATENT DOCUMENTS

| JP | 5-63199 A | 3/1993 |
| JP | 10-209147 A | 8/1998 |
| JP | 10-311750 A | 11/1998 |
| JP | 2004-294207 A | 10/2004 |
| JP | 2009-180504 A | 8/2009 |

OTHER PUBLICATIONS

Corresponding International Search Report with English Translation dated Aug. 2, 2011 (four (4) pages).

* cited by examiner

Primary Examiner — A. Sefer
(74) Attorney, Agent, or Firm — Crowell & Moring LLP (57) ABSTRACT

An object of the present invention is to provide a thermal airflow sensor that prevents moisture absorption by a silicon oxide film formed closest to a surface (formed to be located on an uppermost portion), and that reduces a measuring error. In order to attain the foregoing object, the thermal airflow sensor according to the present invention applies an ion implantation to a silicon oxide film 4, formed closest to a surface (formed to be located on an uppermost portion), by using an atom or molecule selected from at least any one of silicon, oxygen, and an inert element such as argon or nitrogen, in order to increase a concentration of an atom contained in the silicon oxide film 4 more than that before the ion implantation.

7 Claims, 6 Drawing Sheets

THERMAL AIRFLOW SENSOR

TECHNICAL FIELD

The present invention relates to a thermal airflow sensor that is a measuring element used for an air flowmeter, includes a resistance heating element and a resistance temperature detector for measuring temperature, and measures quantity of airflow.

BACKGROUND ART

A thermal air flowmeter that can directly detect quantity of airflow has become mainstream of air flowmeters. In particular, a thermal air flowmeter including a measuring element produced by a semiconductor machining technique has gained attention, since it can reduce cost, and it can be driven with low electric power. Japanese Unexamined Patent Publication No. 10-311750 describes a measuring element (thermal airflow sensor) used for the thermal airflow meter described above. In the thermal air flowmeter described in this Publication, an electric insulating film is formed on a semiconductor substrate, a resistance heating element and a resistance temperature detector are formed on the electric insulating film, and an electric insulator is formed on the resistance heating element and the resistance temperature detector. The region where the resistance heating element and the resistance temperature detector are formed has a diaphragm structure that is formed by removing a part of the semiconductor substrate through anisotropic etching from the backside of the semiconductor substrate.

CITATION LIST

Patent Literature

Patent Literature 1: Japanese Unexamined Patent Application Publication No. Hei10(1998)-311750

SUMMARY OF INVENTION

Technical Problem

In the thermal airflow sensor proposed in Japanese Unexamined Patent Application Publication No. Hei10(1998)-311750, the region where the resistance heating element and the resistance temperature detector are formed has the diaphragm structure, so that the surface is directly exposed to environment. The surface of the thermal air flowmeter is covered by the electric insulating film, and a silicon oxide film formed by a chemical vapor deposition (CVD) method is generally used as the electric insulating film. In general, the density of atoms of the silicon oxide film formed by the CVD method is coarser than that of a thermal oxide film formed by heating an oxide film, so that the silicon oxide film is easy to absorb moisture. When the silicon oxide film formed on the surface by the CVD method absorbs moisture, its volume expands to change a film stress. When the film stress of the silicon oxide film on the surface changes, the shape of the diaphragm where the semiconductor substrate is partly removed changes in the film thickness direction. When the shape of the diaphragm changes, the resistance temperature detector formed in the diaphragm region is distorted, resulting in that an error is caused in the measurement result of the air flowmeter.

An object of the present invention is to provide a thermal airflow sensor that prevents moisture absorption by the silicon oxide film formed closest to the surface (located on the uppermost portion) in order to reduce a measuring error.

Solution to Problem

In order to attain the foregoing object, in the thermal airflow sensor according to the present invention, an ion implantation is applied to the silicon oxide film formed closest to the surface (located on the uppermost layer), in order to increase the concentration (density) of atoms, contained in the silicon oxide film, more than that before the ion implantation.

More specifically, the thermal airflow sensor according to the present invention includes a semiconductor substrate; an electric insulator formed on the semiconductor substrate and including a resistance heating element, a resistance temperature detector, and a silicon oxide film; and a diaphragm formed by removing apart of the semiconductor substrate, the resistance heating element and the resistance temperature detector being formed on the diaphragm, and the silicon oxide film formed as the electric insulator being formed on the resistance heating element and the resistance temperature detector, wherein an ion implantation is applied to the silicon oxide film located on the uppermost layer in order to increase the concentration of an atom, contained in the silicon oxide film on at least the region covering the diaphragm, more than that of the silicon oxide film before the ion implantation.

In this case, it is preferable that an ion implantation layer may be formed on at least a part of the surface of the silicon oxide film in the thickness direction.

Preferably, the thermal airflow sensor may include a thermal oxide film formed on the semiconductor substrate by thermally oxidizing silicon, the resistance heating element and the resistance temperature detector formed on the thermal oxide film, and the silicon oxide film formed on the resistance heating element and the resistance temperature detector and exposed to the surface, wherein the concentration of the atom contained in the ion implantation layer increases more than the concentration of the atom contained in the thermal oxide film.

Preferably, the silicon oxide film may be formed by a CVD method, the ion implantation layer may be formed on the surface of the silicon oxide film, and a silicon oxide film that retains a composition before the ion implantation may be present on an interface with a layer under the silicon oxide film.

Preferably, an ion implanted into the ion implantation layer may contain an atom or molecule of at least one of silicon, oxygen, and inert element.

Preferably, the inert element may contain at least either one of argon or nitrogen.

Preferably, the ion implantation layer may be formed on the region covering the diaphragm, and a region where the ion implantation is not applied may be formed on the outside of the diaphragm.

Advantageous Effects of Invention

According to the present invention, the moisture absorption by the silicon oxide film can be prevented, whereby a change in a detection property of the air flowmeter when environment such as moisture changes can be suppressed. This application is based upon and claims the benefit of priority from Japanese Patent Application No. 2010-165449, the entire contents of which are incorporated herein by reference.

DESCRIPTION OF EMBODIMENTS

Embodiments of the present invention will be described below.

First Embodiment

Figure 1:
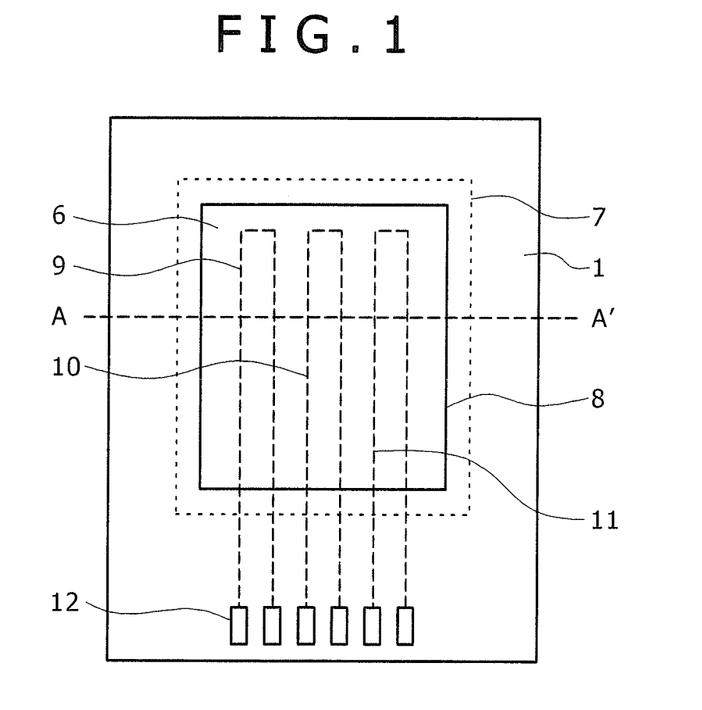
FIG. 1 is a schematic plan view of a measuring element according to a first embodiment of the present invention.
Figure 2:
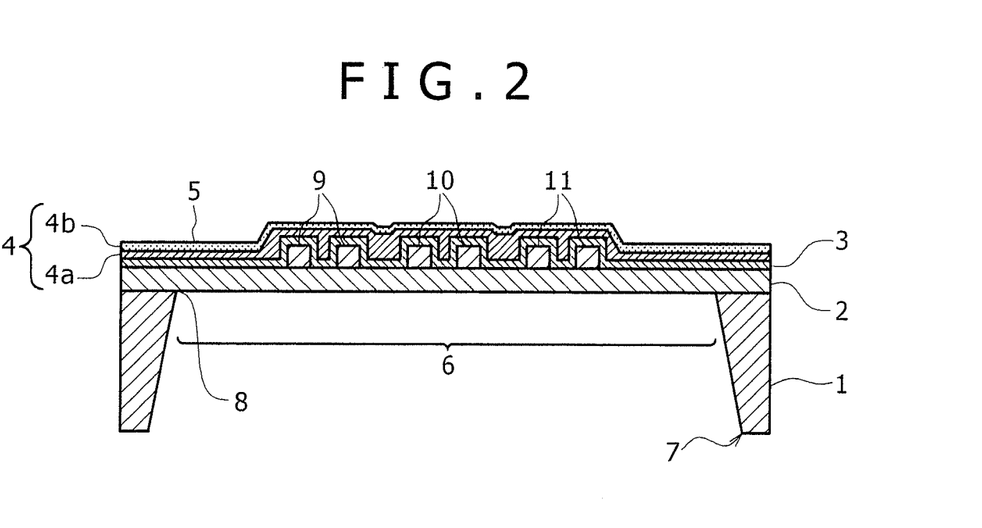
FIG. 2 is an enlarged sectional view according to the first embodiment of the present invention.

A thermal airflow sensor according to the first embodiment of the present invention will be described with reference to FIGS. 1 and 2. FIG. 1 is a schematic plan view of the thermal airflow sensor, and FIG. 2 is an enlarged sectional view along A-A' line in FIG. 2.

As illustrated in FIG. 1, the thermal airflow sensor (a measuring element used for a thermal air flowmeter) according to the present embodiment includes a silicon substrate 1 serving as a semiconductor substrate, a resistance heating element 10, resistances temperature detectors 9 and 11 for measuring air temperature, a terminal electrode 12, and a diaphragm portion 6. Numeral 8 denotes an end of the diaphragm portion 6.

A manufacturing method according to the present embodiment will be described with reference to FIG. 2.

The silicon substrate 1 is thermally oxidized to form a thermal oxide film 2 serving as a lower electric insulating film. Polycrystalline silicon (Si) is deposited on the thermal oxide film 2, and patterned to form the resistance heating element 10 and the resistance temperature detectors 9 and 11. Phosphor or the like is doped into the polycrystalline silicon to adjust a resistance value. The resistance heating element 10 and the resistance temperature detectors 9 and 11 may be made of a metal such as platinum or molybdenum, instead of the polycrystalline silicon. A silicon nitride (SiN) film 3 and a silicon oxide film 4, serving as an upper electric insulating film, are deposited on the resistance heating element 10 and the resistance temperature detectors 9 and 11. Thereafter, silicon (Si) or oxygen (O or $O_2$) alone or both of them are implanted into the silicon oxide film 4 by an ion implantation, and then, an annealing process is performed for about 30 to 60 minutes at 700 to 850° C. to form an ion implantation layer 5. The terminal electrode 12 illustrated in FIG. 1 is formed by depositing aluminum or gold after the deposition of the polycrystalline silicon. Finally, the diaphragm portion 6 is formed from the back surface by using etching solution such as KOH with the silicon oxide film being used as a mask. The diaphragm portion 6 may be formed by a dry etching process. Numeral 8 in FIG. 2 denotes a position of the end of the etching mask serving as a mask material. The portion outside the end of the etching mask indicated by numeral 8 is covered by the mask material, and with this state, the etching is executed, whereby the silicon substrate corresponding to the diaphragm portion 6 is removed.

An operation and effect of the present embodiment will be described below.

In the present embodiment, the upper isolated electrode film includes two layers, which are the silicon nitride (SiN) film 3 and the silicon oxide film 4. However, the upper film may include more layers. In any cases, the silicon oxide film 4 located on the uppermost layer of the upper isolated electrode film is formed by the CVD method, so that the density (concentration) of atom (or molecule, hereinafter merely referred to as atom) of this film is coarse, compared to the thermal oxide film. Therefore, the silicon oxide film 4 is easy to absorb moisture, and moisture absorption is easy to occur. When the silicon oxide film 4 formed by the CVD method and located on the uppermost layer absorbs moisture, the film expands, and hence, the film stress changes. Since a part of the silicon substrate 1 is removed on the diaphragm portion 6, the shape of the diaphragm portion 6 changes because of the change in the film stress of the silicon oxide film 4 located on the uppermost layer.

Figure 3:
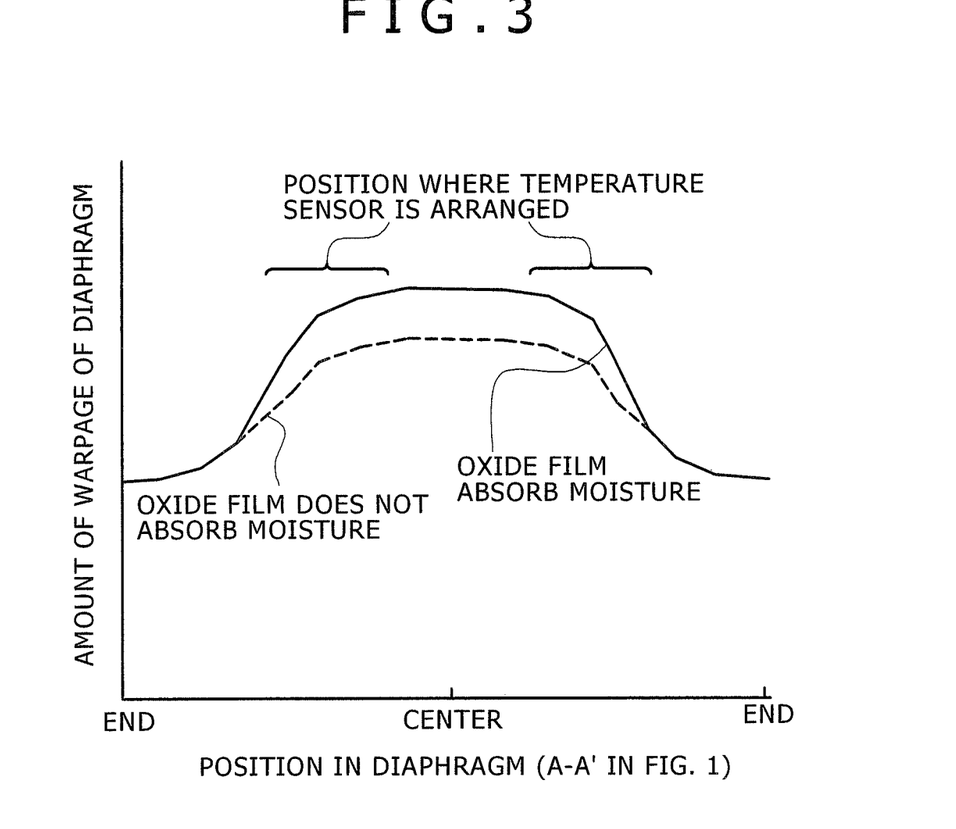
FIG. 3 is a view illustrating an amount of warpage of a diaphragm portion 6.

FIG. 3 is a graph illustrating an amount of warpage of the diaphragm portion 6, and this graph illustrates the amount of warpage between both ends of the diaphragm portion 6 on A-A' line in FIG. 1. It is general that the diaphragm portion 6 warps in the film thickness direction as illustrated in FIG. 3. The resistance temperature detectors 9 and 11 are formed on the diaphragm portion 6. Therefore, when the shape of the diaphragm portion 6 changes, the resistance temperature detectors 9 and 11 are distorted, and the amount of distortion of the resistance temperature detectors 9 and 11 varies due to the change in the film stress caused by the change in the amount of absorbed moisture. When the amount of distortion of the resistance temperature detectors 9 and 11 varies, the resistance value changes due to a piezoresistive effect, which generates an error in the measured quantity of airflow.

The change in the film stress caused by the moisture absorption is caused because the density (concentration) of atom of the silicon oxide film 4, formed by the CVD method and located on the uppermost layer, is low. Therefore, in order to increase the density (concentration) of the atom of the silicon oxide film 4 located on the uppermost layer, an atom or molecule of at least one of silicon, oxygen, and an inert element such as argon or nitrogen is implanted into the silicon oxide film 4 after the deposition of the silicon oxide film 4, and then, an annealing process is performed at about 700 to 850° C. for defect recovery.

In the present embodiment, the ion implantation is applied to the silicon oxide film 4 formed by the CVD method to form the ion implantation layer 5. The silicon oxide film 4 is made of silicon dioxide ($SiO_2$). Accordingly, when the ion implantation is applied, the ion implantation layer 5 includes at least a molecule, and may include silicon, oxygen, and other impurity atoms together with the molecule in some cases. In the present embodiment, the concentration (density) of the atoms that are the total of all atoms contained in the film and the atoms constituting the molecule is important. Therefore, in the specification of the present invention, the concentration (density) of the atoms that are the total of all atoms contained in the film and the atoms constituting the molecule is merely referred to as "atom concentration" or "concentration of atom".

In the present embodiment, silicon and oxygen are implanted into the silicon oxide film 4 by the ion implantation. Therefore, the ion implantation layer 5 is also the layer of the silicon oxide film, like the other portion (layer) 4a where the ion implantation is not applied, although the concentration of silicon dioxide (SiO₂) is different. When the inert element such as argon or nitrogen is implanted by the ion implantation, the ion implantation layer 5 becomes the layer of the silicon oxide film containing impurity, as described later. In any cases, the ion implantation layer 5 is formed on a part 4b of the silicon oxide film 4, formed by the CVD method, on the upper surface, and a part 4a on the lower surface (on the depth layer) is left as the layer of the silicon oxide film having the concentration same as that of the silicon oxide film 4 before the ion implantation.

When the silicon oxide film 4 is thin, or a significant moisture-absorption preventing effect is required, the whole silicon oxide film 4 can be the ion implantation layer 5.

Figure 4:
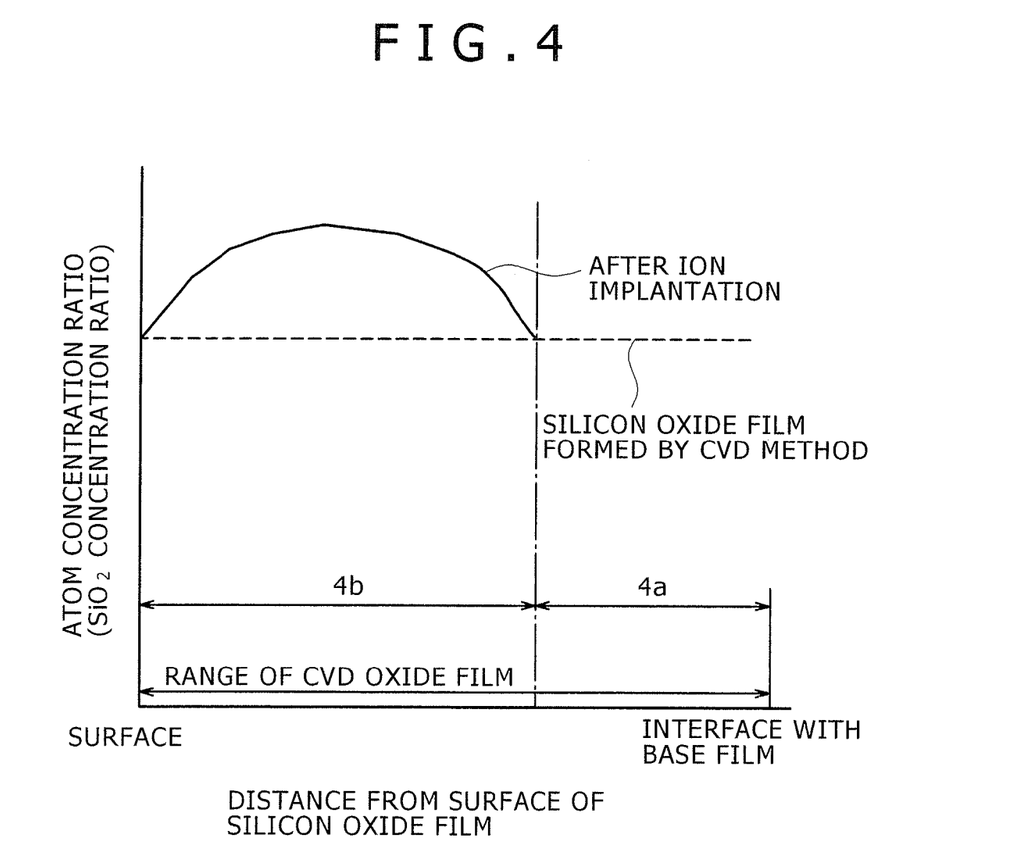
FIG. 4 is a graph illustrating a ratio of a density of an oxide silicon ($SiO_2$) in a silicon oxide film 4 formed by a CVD method to a density of oxide silicon ($SiO_2$) in an ion implantation layer 5.

FIG. 4 is a graph illustrating a ratio of a concentration (density) of silicon dioxide ($SiO_2$) in the ion implantation layer 5 to the concentration (density) of silicon dioxide ($SiO_2$) formed by the CVD method, the concentration (density) of silicon dioxide ($SiO_2$) formed by the CVD method being defined as a reference. An abscissa axis indicates a distance between the surface of the silicon oxide film 4 and an interface of a base film (in the present embodiment, SiN film 3) in the thickness direction. As illustrated in FIG. 4, the concentration (density) of silicon dioxide ($SiO_2$) near the surface can be increased more than the concentration (density) of silicon dioxide ($SiO_2$) near the interface (the silicon oxide film 4 where the ion implantation is not applied) with the base film. Accordingly, the moisture absorption can be reduced, and the change in the film stress can be prevented, whereby the measuring error in the quantity of airflow can be reduced.

Figure 5:
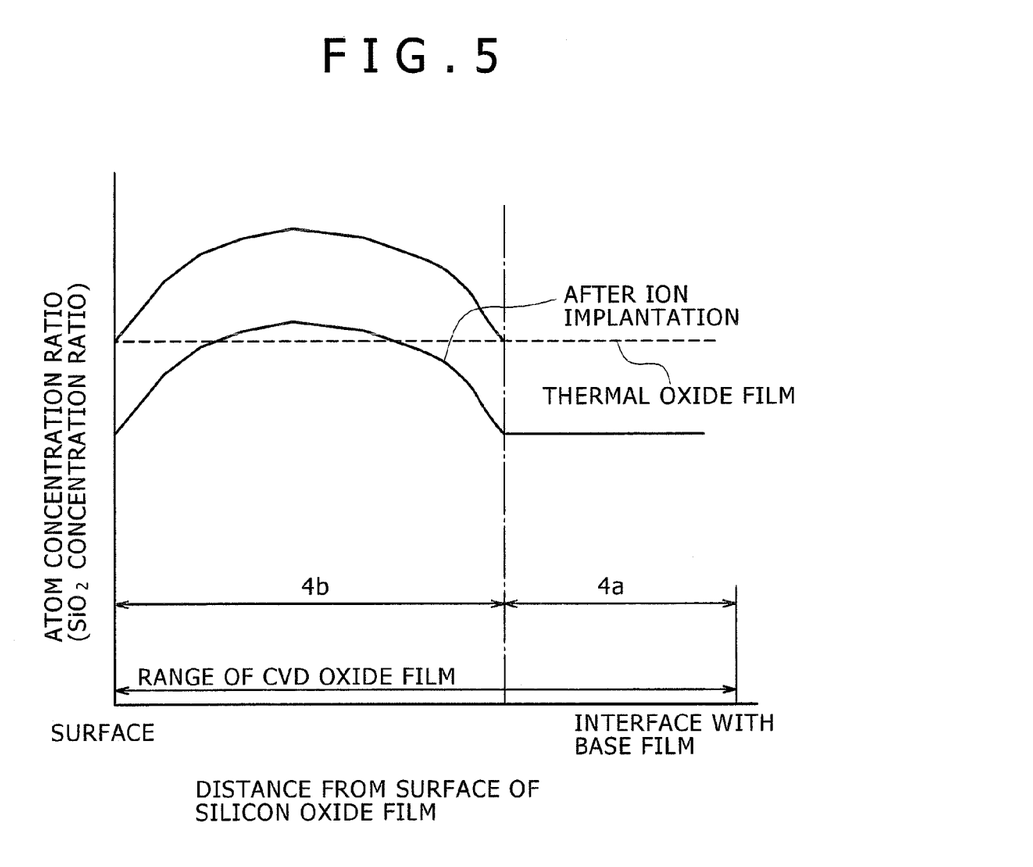
FIG. 5 is a graph illustrating a ratio of a density of oxide silicon ($SiO_2$) in a thermal oxide film 2 to a density of oxide silicon ($SiO_2$) in the silicon oxide film 4.

Subsequently, the amount of implanted ion will be described with reference to FIG. 5. FIG. 5 illustrates a ratio of the density of silicon dioxide ($SiO_2$) in the silicon oxide film 4 to the density of silicon dioxide ($SiO_2$) in the thermal oxide film 2, wherein the density of silicon dioxide in the thermal oxide film 2 is defined as a reference. An abscissa axis indicates a distance between the surface of the silicon oxide film 4 and the interface of the base film (in the present embodiment, SiN film 3) in the thickness direction.

The concentration (density) of the atom contained in the ion implantation layer 5 increases by implanting an atom or molecule of at least one of silicon, oxygen, and an inert element such as argon or nitrogen into the silicon oxide film 4 formed by the CVD method. Therefore, even a small amount of implantation is naturally effective. According to our experiment, the change in the film stress due to the moisture absorption by the thermal oxide film 2 was not observed. Therefore, the density of the atoms constituting the ion implantation layer 5 is preferably set to be equal to or higher than the density of the atoms of the thermal oxide film 2.

As illustrated in FIG. 5, silicon and oxygen are implanted by the ion implantation in such a manner that the concentration (density) of silicon dioxide ($SiO_2$) in a certain range of the ion implantation layer 5 in the thickness direction is larger than the concentration (density) of silicon dioxide ($SiO_2$) of the thermal oxide film 2.

Figure 6:
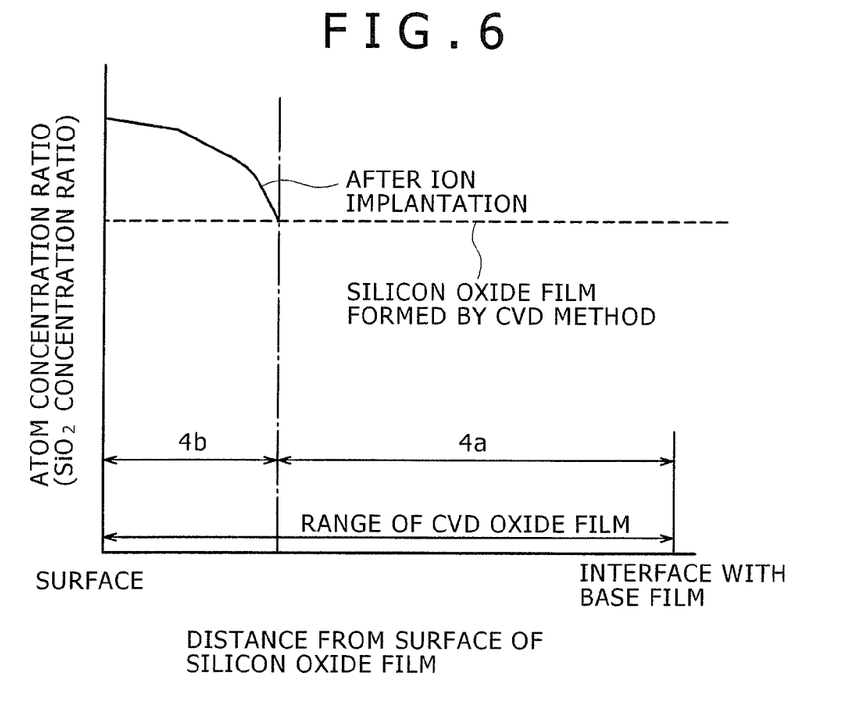
FIG. 6 is an example in which a distribution of the density ratio of oxide silicon ($SiO_2$) in FIG. 5 is improved.

FIG. 6 illustrates an example in which the distribution of the concentration ratio (density ratio) of silicon dioxide ($SiO_2$) in FIG. 5 is improved. Since the moisture absorption occurs on the surface first, the concentration (density) of the atoms of the ion implantation layer 5 is preferably set to be higher in the vicinity of the surface as illustrated in FIG. 6. FIG. 6 illustrates the case of the silicon oxide film formed by the CVD method. Similarly, the atom concentration of the thermal oxide film is preferably set to be higher in the vicinity of the surface. The object is attained by the enhancement of the atom concentration (atom density). Therefore, instead of increasing the atom concentration of silicon and atom concentration of oxygen simultaneously, silicon or oxygen alone may be implanted by the ion implantation.

Not only the concentration (density) of silicon or oxygen contained in the silicon oxide film 4 but also the concentration (density) of other elements contained in the silicon oxide film 4 can be increased. When an active element is implanted, an insulating property might be deteriorated. In view of this, the inert element (e.g., argon, nitrogen) is preferably implanted as the other impurity element. The concept for the concentration ratio (density ratio) in this case is the same as described with reference to FIGS. 4, 5, and 6.

Figure 7:
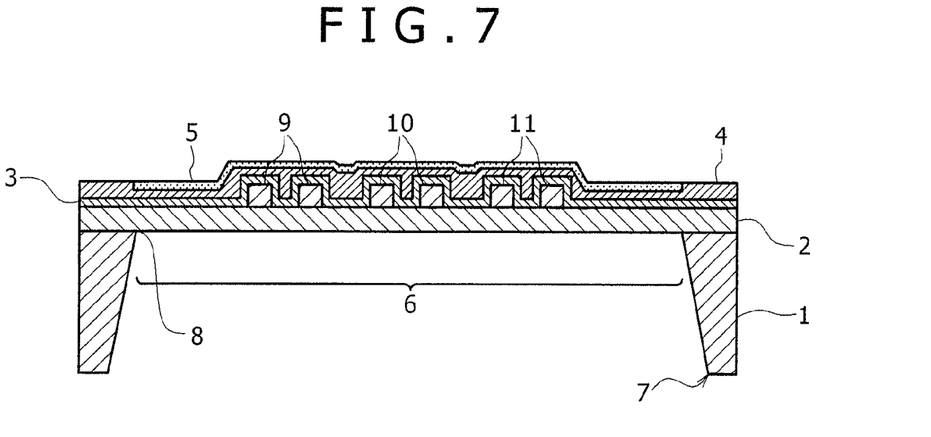
FIG. 7 is an example in which a region including the diaphragm portion 6 is formed on the ion implantation layer 5, and a region where an ion implantation is not applied is formed at the outside of the diaphragm portion 6.

The change in the shape of the diaphragm due to the change in the film stress occurs when a film whose stress changes is arranged on the diaphragm portion 6. The silicon substrate 1 is thick and has high rigidity, so that the shape of the diaphragm portion 6 does not change even if the film stress of the silicon oxide film 4 changes on the silicon substrate 1. Therefore, the ion implantation layer 5 may be formed on the region including the diaphragm portion 6, and a region where the ion implantation is not applied may be formed at the outside of the diaphragm portion 6, as illustrated in FIG. 7. Alternatively, the amount of ion implantation may be reduced on the region at the outside of the diaphragm portion 6, compared to the region including the diaphragm portion 6.

The concentration (density) of atoms such as silicon or oxygen constituting the silicon oxide film 4a, to which the ion implantation is not applied, and the ion implantation layer 5 can be measured according to SIMS analysis.

In the present embodiment, the thermal oxide film 2 is used as the electric insulating film serving as the layer under the resistance heating element 10 and the resistance temperature detectors 9 and 11. However, it is obvious that the effect of the present invention can be provided by a composite film of the thermal oxide film and SiN film. Specifically, when the diaphragm portion is made of a film in the diaphragm structure, the dependence of the diaphragm shape on the film stress is noticeable, so that the method described above is effective for this structure.

In the present embodiment, the ion implantation layer is formed on the silicon oxide film. However, the ion implantation layer is effectively formed on the other films, so long as the film absorbs moisture, and its film stress changes. Under present circumstances, a film formed by the CVD method and a plasma TEOS oxide film are popular as the silicon oxide film 4. However, the ion implantation to the silicon oxide film 4 in the present embodiment and to the film used as being arranged like the silicon oxide film 4 is effective, when a method of forming the silicon oxide film 4 located on the uppermost layer or the film used as being arranged like the silicon oxide film 4 is used in such a manner that the concentration (density) of atoms contained in these films becomes smaller than the thermal oxide film 2 to allow these films to easily absorb moisture.

Figure 8:
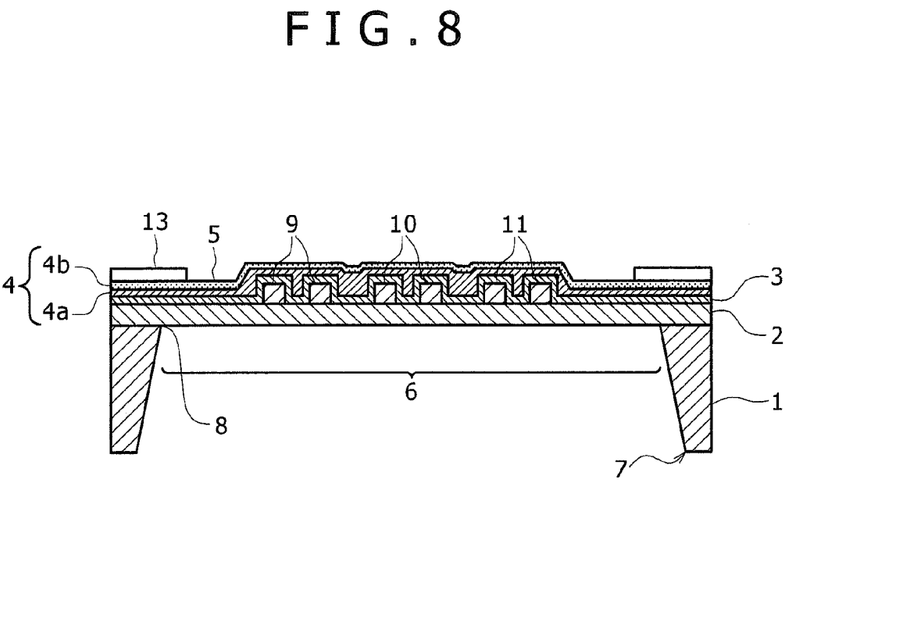
FIG. 8 is an example in which a PIQ film serving as a protection film is deposited at an end of the diaphragm portion 6.

There may be the case in which, as illustrated in FIG. 8, a protection film such as PIQ film 13 or the like is deposited on the end of the diaphragm portion 6 in order to protect the measuring element from dust. Since the deposition of the PIQ film 13 is only in the vicinity of the end of the diaphragm portion 6, the method according to the present invention is also effective for this case.

LIST OF REFERENCE SIGNS

1 Silicon substrate
2 Thermal oxide film

3 SiN film
4 Silicon oxide film
5 Ion implantation layer
6 Diaphragm portion
7 Etching mask end
8 End of diaphragm portion
9, 11 Resistance temperature detector
10 Resistance heating element
12 Terminal electrode
13 PIQ film

The invention claimed is:

1. A thermal airflow sensor comprising: a semiconductor substrate; an electric insulator formed on the semiconductor substrate and including a resistance heating element, a resistance temperature detector, and a silicon oxide film; and a diaphragm formed by removing a part of the semiconductor substrate, the resistance heating element and the resistance temperature detector being formed on the diaphragm, and the silicon oxide film formed as the electric insulator being formed on the resistance heating element and the resistance temperature detector, wherein
the silicon oxide film has an upper layer and a lower layer, and an ion implantation is applied to the upper layer.

2. The thermal airflow sensor according to claim 1, wherein an ion implantation layer is formed on at least a certain region on the surface of the silicon oxide film in the thickness direction.

3. The thermal airflow sensor according to claim 2, comprising:
a thermal oxide film formed on the semiconductor substrate by thermally oxidizing silicon; the resistance heating element and the resistance temperature detector formed on the thermal oxide film; and the silicon oxide film formed on the resistance heating element and the resistance temperature detector and exposed to the surface, wherein
the concentration of the atom contained in the ion implantation layer becomes higher than the concentration of atom contained in the thermal oxide film.

4. The thermal airflow sensor according to claim 2, wherein the silicon oxide film is formed by a CVD method, the ion implantation layer is formed on the surface of the silicon oxide film, and a silicon oxide film retaining the composition before the ion implantation is present on an interface with a layer under the silicon oxide film.

5. The thermal airflow sensor according to claim 2, wherein an ion implanted into the ion implantation layer contains an atom or molecule of at least any one of silicon, oxygen, and an inert element.

6. The thermal airflow sensor according to claim 5, wherein the inert element contains at least either one of argon and nitrogen.

7. The thermal airflow sensor according to claim 2, wherein the ion implantation layer is formed only on a region covering the diaphragm, and a region where the ion implantation is not applied is formed at the outside of the diaphragm.

* * * * *